United States Patent
Berben et al.

(10) Patent No.: US 8,242,528 B2
(45) Date of Patent: Aug. 14, 2012

(54) CONVERSION LED

(75) Inventors: Dirk Berben, Bobingen (DE); Tim Fiedler, Munich (DE); Renate Hirrle, Augsburg (DE); Guenter Huber, Schrobenhausen (DE); Frank Jermann, Koenigsbrunn (DE); Martin Zachau, Geltendorf (DE)

(73) Assignee: OSRAM AG, Munich (DE)

( * ) Notice: Subject to any disclaimer, the term of this patent is extended or adjusted under 35 U.S.C. 154(b) by 249 days.

(21) Appl. No.: 12/747,575

(22) PCT Filed: Nov. 17, 2008

(86) PCT No.: PCT/EP2008/065648
§ 371 (c)(1),
(2), (4) Date: Jun. 11, 2010

(87) PCT Pub. No.: WO2009/077277
PCT Pub. Date: Jun. 25, 2009

(65) Prior Publication Data
US 2010/0276714 A1 Nov. 4, 2010

(30) Foreign Application Priority Data
Dec. 14, 2007 (DE) .................. 10 2007 060 198

(51) Int. Cl.
*H01L 33/00* (2010.01)
(52) U.S. Cl. ............. 257/98; 257/103; 257/E33.06; 257/E33.056
(58) Field of Classification Search .............. 257/98, 257/103, E33.06, E33.056
See application file for complete search history.

(56) References Cited

U.S. PATENT DOCUMENTS

| | | | |
|---|---|---|---|
| 6,255,670 B1 | 7/2001 | Srivastava et al. |
| 6,466,135 B1 | 10/2002 | Srivastava et al. |
| 7,077,978 B2 | 7/2006 | Setlur et al. |
| 7,267,787 B2 | 9/2007 | Dong et al. |
| 2005/0253114 A1 | 11/2005 | Setlur et al. |
| 2006/0027781 A1 | 2/2006 | Dong et al. |

FOREIGN PATENT DOCUMENTS

| | | |
|---|---|---|
| WO | 2006027786 A2 | 3/2006 |
| WO | 2006072919 A2 | 7/2006 |
| WO | 2007005486 A2 | 1/2007 |
| WO | 2007020556 A1 | 2/2007 |
| WO | 2007125493 A2 | 11/2007 |

OTHER PUBLICATIONS

International Search Report of PCT/EP2008/065648 dated Mar. 4, 2009.

*Primary Examiner* — Tan N Tran

(57) ABSTRACT

A conversion LED is provided. The conversion LED may include a primary light source which emits in the short-wave radiation range below 420 nm, and a luminophore placed in front of it consisting of the BAM system as a host lattice for at least partial conversion of the light source's radiation into longer-wave radiation, wherein the BAM luminophore is applied as a thin layer having a thickness of at most 50 μm directly on the surface of the light source, the BAM luminophore having the general stoichiometry $(M_{1-r} Mg_r)O*k(Al_2O_3)$, where r=0.4 to 0.6 and M=EAeEu1−e, with EA=Ba, Sr, Ca, and e=0.52 to 0.8, and k=1.5 to 4.5.

20 Claims, 7 Drawing Sheets

CONVERSION LED

RELATED APPLICATIONS

The present application is a national stage entry according to 35 U.S.C. §371 of PCT application No.: PCT/EP2008/065648 filed on Nov. 17, 2008, which claims priority from German application No.: 10 2007 060 198.2 filed on Dec. 14, 2007.

TECHNICAL FIELD

Various embodiments are based on a conversion LED, frequently also referred to as a LUCOLED. Various embodiments furthermore relate to a light source produced with such an LED and to a lighting system having such a conversion LED.

BACKGROUND

U.S. Pat. No. 7,077,978 describes a luminophore based on BAM, which is doped with Eu and Mn. This luminophore is intended for use in UV LEDs. A similar luminophore is known from WO 2006/072919. A BAM-based luminophore doped only with Eu is furthermore known from WO 2006/027786. The conventional doping for such a luminophore is a maximum $Eu^{2+}$ content of at most 50 mol % with respect to Ba.

SUMMARY

Various embodiments provide a conversion LED having a primary light source in the short-wavelength range, which does not exhibit any premature ageing. The peak wavelength of the excitation is in this case intended to be at most 420 nm.

The conversion LED includes a primary light source which emits UV radiation. According to the invention, the light source is at least one chip on the surface of which there is a new type of BAM luminophore, the layer thickness being at most 50 µm, preferably at most 30 µm. In particular, the layer thickness is from 5 to 20 µm. The novel luminophore absorbs so effectively that no harmful UV radiation leaves the layer.

The previously known BAM luminophores typically have the stoichiometry BaMgAl10O17:Eu. Here, Eu is a divalent activator which is conventionally added in a maximum concentration of at most 50% with respect to Ba, calculated as a molar percentage. Occasionally, Mn is also used as a coactivator in order to move the emission to longer wavelengths. The emission therefore lies in the blue or blue-green spectral range.

In particular, the production of efficient white LEDs on the basis of UV LEDs requires efficient thermally stable blue luminophores. This presupposes good absorption by the luminophores above all in the 340-420 nm range, in particular 380-410 nm for near-UV LEDs, and a high quantum efficiency. The luminophores must not saturate at high excitation intensities, as occur particularly in high-power LEDs. Furthermore, they should exhibit the least possible thermal quenching of the luminescence due to the high temperatures of up to 200° C. occurring in high-power LEDs.

At present, SCAP:Eu (Sr, Ca chloroapatites) and BAM:Eu (BaMg aluminate) are predominantly used as blue emitting luminophores for this purpose. With the conventionally used Eu concentrations of between 5 and 15% Eu, SCAP already exhibits very high absorption in the 380-410 nm spectral range. The quantum efficiency and thermal quenching behavior are no longer optimal with these Eu concentrations, however, and are inferior to the case of BAM:Eu. Furthermore, the short-wavelength narrowband emission by SCAP is not always advantageous when efficient white LEDs with high color rendering are to be produced. BAM:Eu is used with Eu concentrations <50% (typically rather <30%), but has the disadvantage compared with SCAP of inferior absorption in the 380-410 nm range.

Predominant substitution of the $Ba^{2+}$ ion by $Eu^{2+}$ in the BAM host lattice BaMgAl10O17 surprisingly gives a very efficient luminophore. In this case, it is important for the Ba content to be adjusted so that excessive energy migration between the $Eu^{2+}$ ions is prevented. Very highly suitable luminophores are typically obtained with Ba concentrations of between 35 and 45%, according to the formula $Ba_xEu_{1-x}MgAl_{10}O_{17}$ with x=0.35 to 0.45.

A typical example is Eu0.6Ba0.4MgAl10O17. Here, the 40% proportion of $Ba^{2+}$ effectively stops excessive energy migration and therefore thermal luminescence mixing. The new luminophore is suitable, for example, for "color on demand" LEDs or for white LEDs. It can be tailored for different color temperatures and applications with high efficiency and good color rendering.

The Eu aluminate luminophore according to the invention has extremely low thermal quenching. At 175° C., the efficiency is still more than 80% of the efficiency at 25° C. The powder tablet absorption of the compound Eu0.6Ba0.4MgAl10O17 is already more than 80% with excitation at 400 nm, and at 380 nm it is actually greater than 90% with luminophore particle sizes smaller than 12 µm. A highly suitable particle size is from 0.5 µm to 10 µm. The term particle size is to be interpreted here as the d50 value, more accurately as the median of the volume-referenced particle size distribution measured by means of laser scattering, for example CILAS.

The quantum efficiency (QE) of the novel luminophore is typically 84%+/−5% with excitation at 400 nm. With even shorter-wavelength excitation, QE values of more than 90% can be achieved.

Here, use of the often conventional codoping with Mn is deliberately avoided. In that case, Mn occupies the lattice site of Mg. Such a luminophore, however, exhibits appreciably inferior properties than a luminophore doped only with Eu. The Mn ion is much more sensitive to saturation.

The heavy europium doping can also be applied to BAM luminophores with a different stoichiometry and composition. In another embodiment, the BAM luminophore is described by the stoichiometry $Ba_xEu_{1-x}Mg_{1+d}Al_{10+2f}O_{17+d+3f}$ Here, $0.2 \leq x \leq 0.48$; preferably $0.35 \leq x \leq 0.45$;
$0 \leq d \leq 0.1$;
$-0.1 \leq f \leq 1.0$.

These are compounds which can be stoichiometrically described quite simply, these varieties being known for BAM. In principle, such host lattices are previously known for example from WO 2006/072919. In its most general form, the BAM host lattice therefore also includes stoichiometries for example of the type BaAl12O19, or even more generally formulated it can be represented by a multiplicity of stoichiometries for BAM so that it is a mixture of two aluminates, with a first aluminate being low in Ba corresponding to the stoichiometry 0.82BaO*6Al2O3, and with a second aluminate containing Mg and representing the actual BAM BaMgAl10O17. Because the low-Ba aluminate and the actual BAM BaMgAl10O17 have the same crystal structure as beta-Al2O3, the two compounds form solid solutions with a beta-Al2O3 structure. A general aluminate stoichiometry can therefore be described as $\{(1-a)*(0.82[Ba_xEu_{1-x}O]*6$

[Al$_2$O$_3$])}*a(Ba$_x$Eu$_{1-x}$MgAl$_{10}$O$_{17}$). Here a is in principle given by 0≦a≦1. Preferably, a is at least 0.65, particularly preferably at least 0.8. The value of x lies at from at least 0.52 up to 0.8. Preferably, x=0.55 to 0.65.

For less stressful applications, Mn may also be codoped as a replacement for Mg according to the aluminate stoichiometry {(1−a)*(0.82[Ba$_x$Eu$_{1-x}$O]*6 [Al$_2$O$_3$])}*a(Ba$_x$Eu$_{1-x}$Mg$_{1-z}$Mn$_z$Al$_{10}$O$_{17}$).

Here, z should in particular be at most 0.15, preferably at most 0.04.

In this presentation, Ba may furthermore be partially or fully substituted by Sr, or also partially by Ca.

In another embodiment, the high europium concentration may be applied to luminophores in which Ba is partially or fully replaced by Sr and/or Ca, and which are derived from the actual BAM. This luminophore is described by the stoichiometry M$_x$Eu$_{1-x}$Mg$_{1+d}$Al$_{10+2j}$O$_{17+d+3f}$ with M=(Ba, Sr, Ca), where M is preferably represented by Ba$_z$ (Sr, Ca)$_{1-z}$, with z≧0.7.

In this case, 0.2≦x≦0.48; preferably 0.35≦x≦0.45;
0≦d≦0.1;
−0.1≦f≦1.0.

In a generalized form, luminophores of this type may also be described in a manner similar to that in EP 529 956. The general formula is (M$_{1-r}$Mg$_r$) O*k Al2O3, where r=0.4 to 0.6. Here, the metal M is doped with europium, i.e. M=EA$_e$Eu$_{1-e}$ with EA=Ba, Sr, Ca. Also, e=0.52 to 0.8, in particular e=0.55 to 0.65. Furthermore, k=1.5 to 4.5.

Such a luminophore is suitable in particular for mixing with other luminophores, for example according to the RGB principle.

In particular, it is suitable to use a mixture of the novel BAM with Zn2SiO4:Mn or BaAl12O19:Mn for the green component and with (Y,Gd)BO3:Eu or YOE, i.e. Y2O3:Eu, for the red component.

Such luminophores may be produced in principle as for known BAM luminophores. Halogen compounds, preferably fluorides and chlorides, have proven suitable as fluxing agents for this. Compounds containing lithium and boron may, however, also be used.

For production, the Al2O3, BaCO3, SrCO3, MgO, Eu2O3, BaF2 reactants are mixed in a tumble mixer or the like for several hours. The reaction temperature should be from 1500 to 1650° C. Forming gas with an H2 content of from 2 to 20% is then introduced. The luminophore is subsequently ground in a mill for about 5 to 30 min. The luminophore may then optionally also be washed with water or dilute acids.

Furthermore, the elements F, Cl, Li, Na, B, La, Ce, Nd, Sm, Pr, Gd, Yb, Lu may also be introduced to a small extent into this general host lattice. In this case, the lattice structure detectable by XRD should essentially remain unchanged. Specifically, the following modifications in particular may be carried out:

replacement of Al to a small extent by B;

substitution of 2M by M1+M3, where M1 is one or more of the monovalent metals Li and/or Na and M3 is one or more of the trivalent rare-earth metals from the group La, Ce, Nd, Sm, Pr, Gd, Yb, Lu;

incorporation of M1+H into the host lattice, where M1 is a monovalent metal as defined above and H is one or more halogens from the group F, Cl; preferably, the total proportion is at most 1%;

incorporation of trivalent rare-earth metals M3+ZZ at interstitial lattice sites, where M3 is as defined above and ZZ is one or more elements from the group F, Cl, O; also mixtures thereof; the proportion of F and Cl is preferably at most 1%, and for O at most 5%;

incorporation of various metallic ions such as Si, which in large concentrations would quench the luminescence, to an extent such that the luminescence is not yet significantly reduced. This means trace proportions which are much less than 1 wt. %.

The luminophore according to the invention may preferably be used for LEDs which emit in the UV range, in order to achieve conversion into the visible spectral range. The excitation is carried out best with a peak wavelength of from 300 to 420 nm, preferably from 340 to 410 nm, particularly preferably at from 380 to 410 nm. All LEDs according to the principle of a conversion LED are suitable as light sources. In this way, on the one hand, color emitting LEDs can be produced, in particular with the use of only a single luminophore of the aluminate type described above, in particular BAM. In particular, it is possible to produce a blue emitting LED with a large FWHM, which forms the basis for LEDs or LED modules with high color rendering.

Other LEDs may however also be produced, to which end at least one further luminophore will generally be used in addition, which either emits either yellow (for a "BY" solution), or red and green emitting luminophores (for an "RGB" solution), as known per se. White emitting LEDs with particularly high color rendering can thereby be produced. The Ra is at least 80, in particular at least 90.

For a BY solution, in particular a garnet such as YAG:Ce or a sion is suitable as an additional luminophore. For an RGB solution, in particular green luminophores such as nitridosilicates and red luminophores such as nitrides are suitable as additional luminophores.

In particular, mixtures of various embodiments of the novel luminophore may also be used, for example blue and blue-green emitting varieties.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced.

Figure 1:
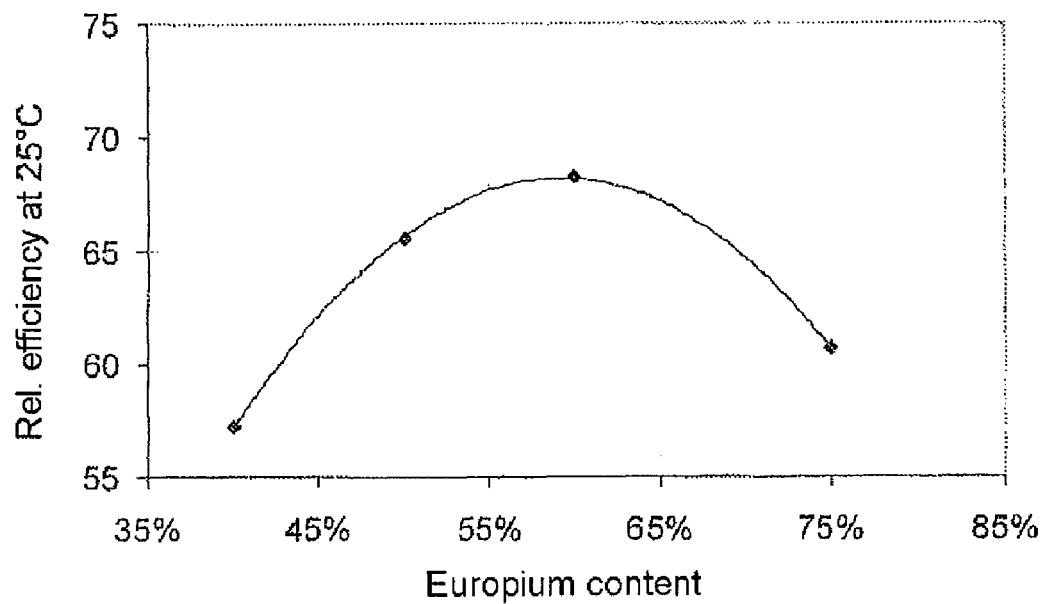
FIG. 1 shows the efficiency of a BAM luminophore at room temperature as a function of the Eu content.

FIG. 1 shows the relative efficiency of a BAM luminophore $Ba_xEu_{1-x}MgAl_{10}O_{17}$ as a function of the Eu content in mol %, expressed in terms of M=(Ba, Eu). It has been found that the optimal Eu concentration at room temperature (25° C.) is about 60% Eu, corresponding to a value x=0.4.

Figure 2:
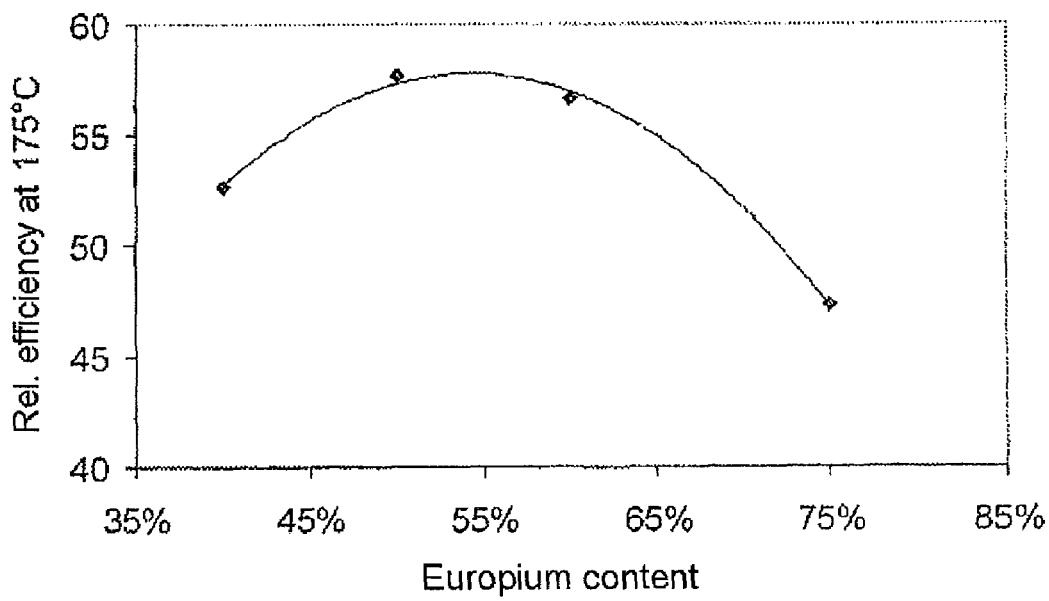
FIG. 2 shows the efficiency of the same BAM luminophore at 175° C. as a function of the Eu content.

The same measurement, relating to a temperature of 175° C., is represented in FIG. 2. It gives the result that the optimal Eu concentration is now about 54%, corresponding to a value x=0.46.

Figure 3:
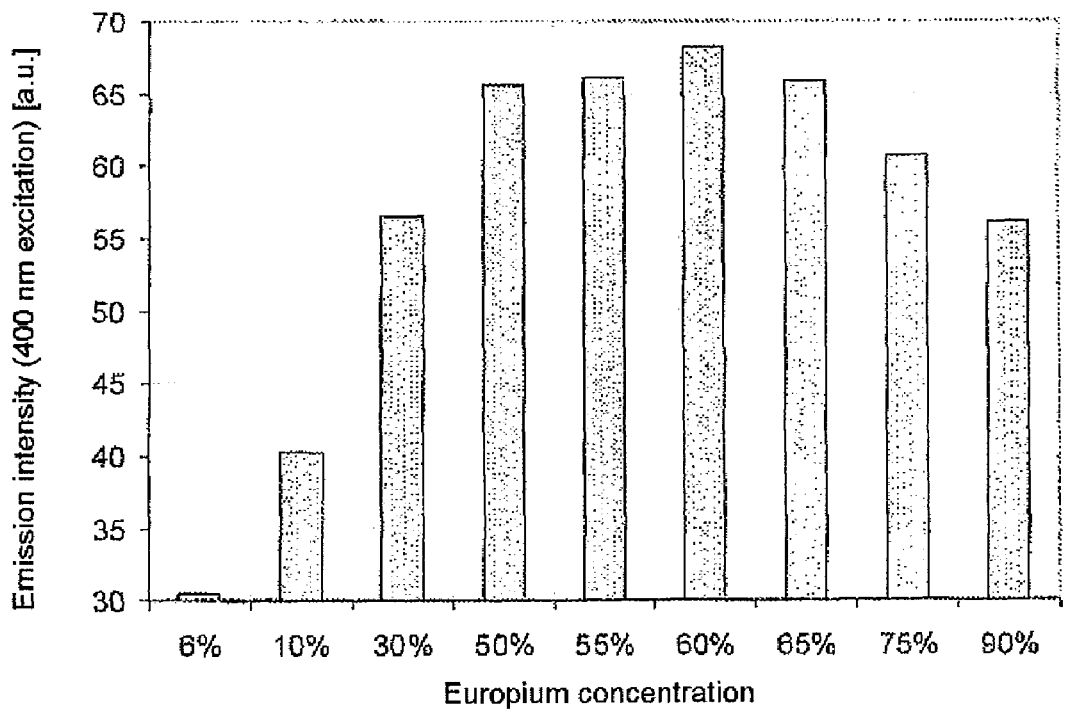
FIG. 3 shows the emission intensity of the same BAM luminophore with 400 nm excitation as a function of the Eu content.

FIG. 3 shows the emission intensity of this luminophore as a function of the Eu concentration with excitation at 400 nm. Surprisingly, the intensity does not reach its maximum until an Eu concentration of about 60%, which again corresponds to a value x=0.4.

Figure 4:
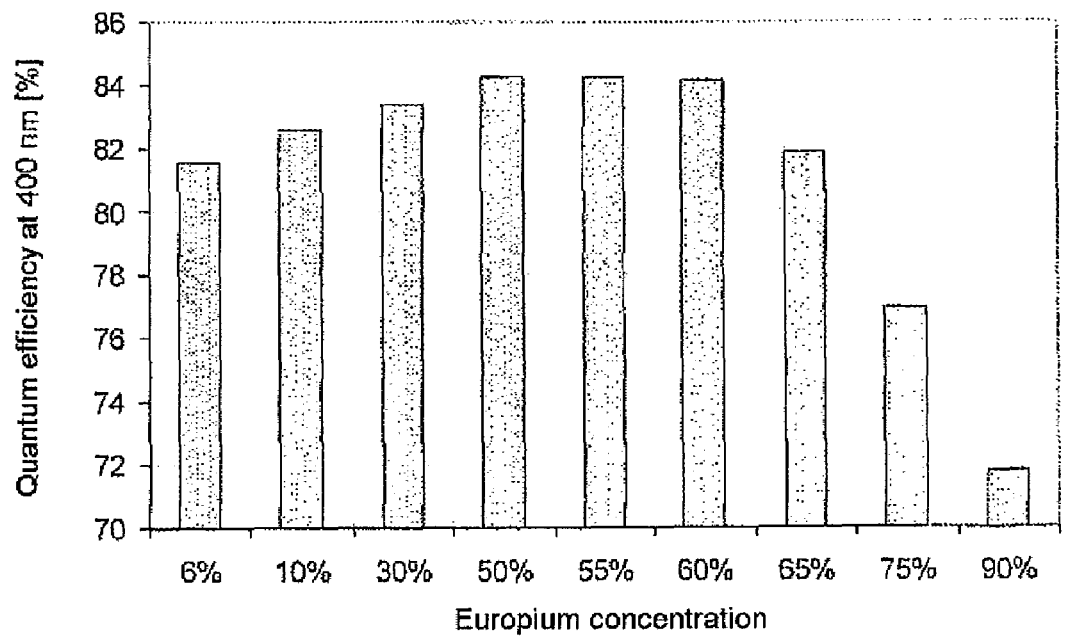
FIG. 4 shows the quantum efficiency of the same BAM luminophore as a function of the Eu content with 400 nm excitation.

FIG. 4 shows the quantum efficiency as a function of the Eu concentration. Surprisingly, with relatively long-wavelength excitation, here for example at 400 nm, the quantum efficiency initially increases with an increasing Eu content. An optimum is found with Eu values in the range of from 50 to 60%, i.e. x=0.4 to 0.5.

Figure 5:
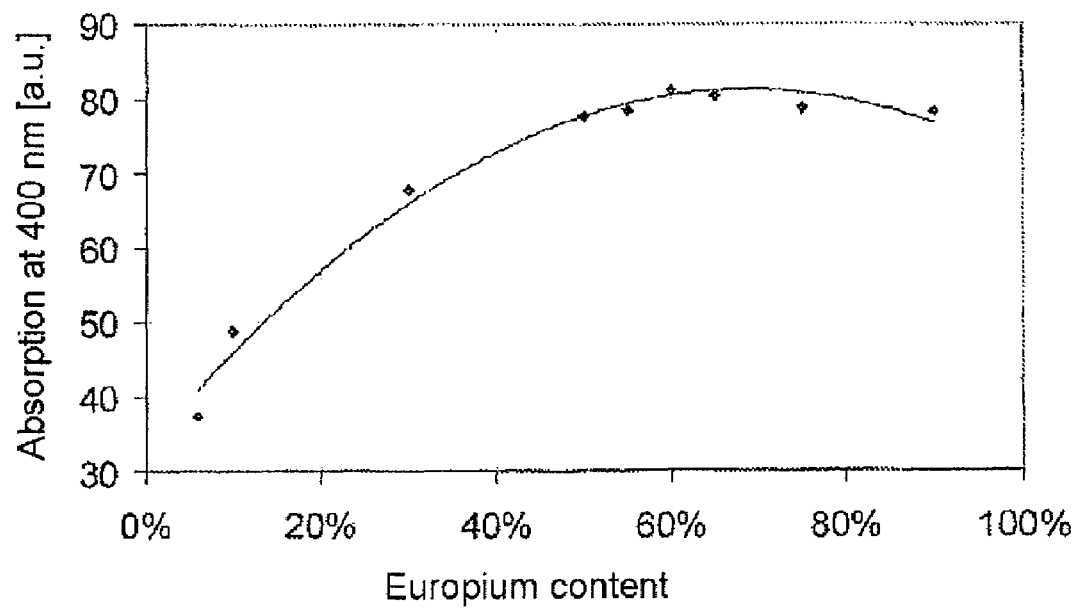
FIG. 5 shows the absorption of the same BAM luminophore with 400 nm excitation as a function of the Eu content.

FIG. 5 shows the absorption of this BAM luminophore, in relation to a powder tablet. It is found that the novel luminophore has much better absorption compared with previously conventional BAM:Eu luminophores.

What is essential for good properties of a conversion LED is the product of QE and A.

Figure 6:
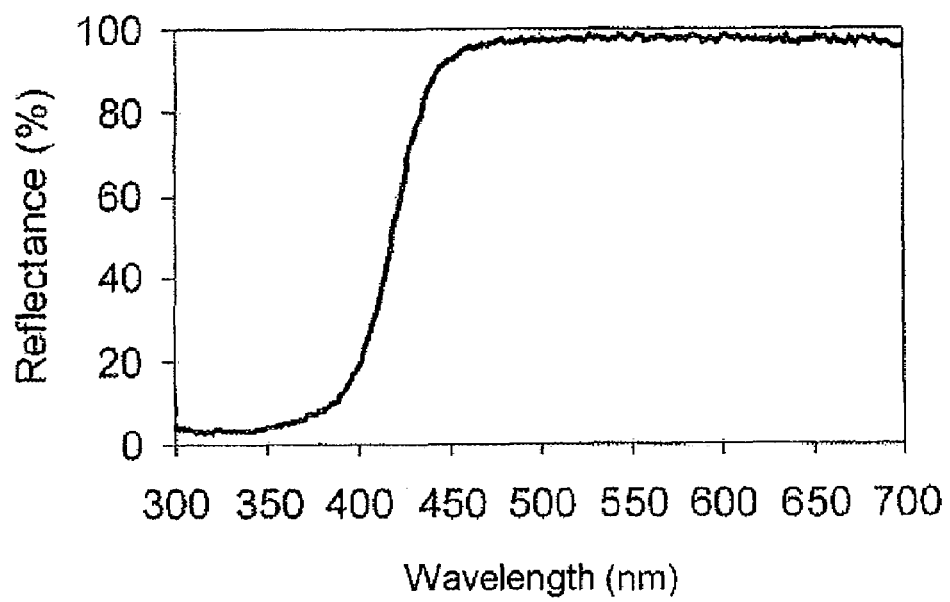
FIG. 6 shows the re-emission of a specific BAM luminophore as a function of wavelength.

FIG. 6 shows the re-emission of the luminophore $Eu_{0.6}Ba_{0.4}MgAl_{10}O_{17}$ present in a powder tablet. It is found that this luminophore has a significantly improved reflectance compared with previous luminophores. This applies in particular for the absorption.

Figure 7:
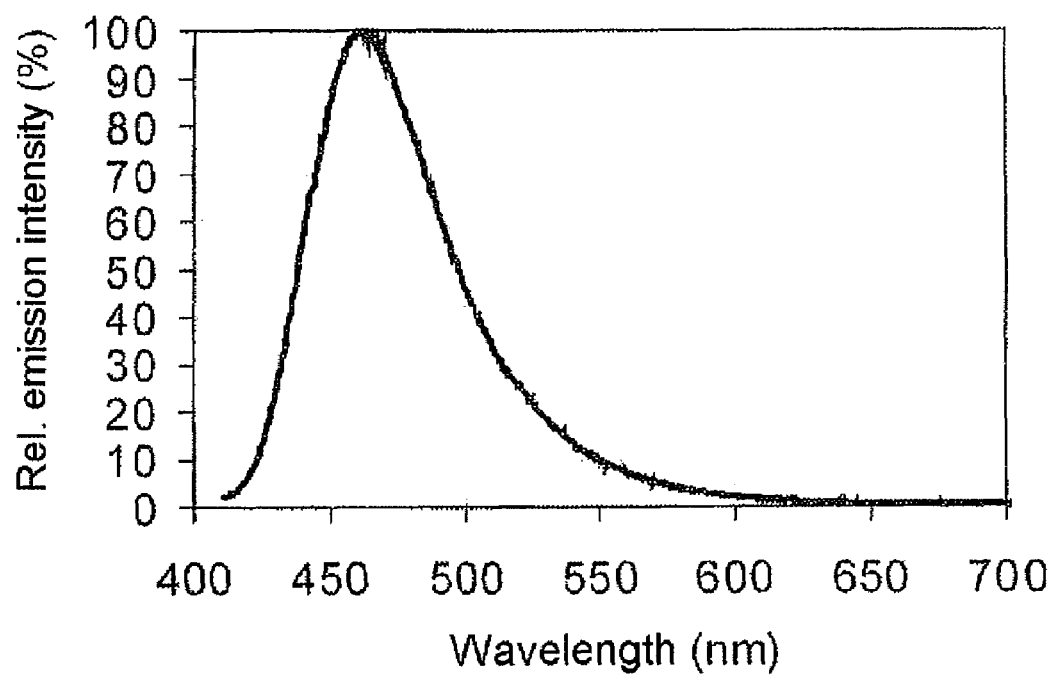
FIG. 7 shows the emission of the same luminophore as a function of wavelength.

FIG. 7 shows the emission of this specific luminophore as a function of wavelength. It is found that the emission behavior is very suitable for LEDs with high color rendering. The emission is at a relatively long wavelength and has a high blue-green component. Here again, the excitation was carried out at 400 nm.

Figure 8:
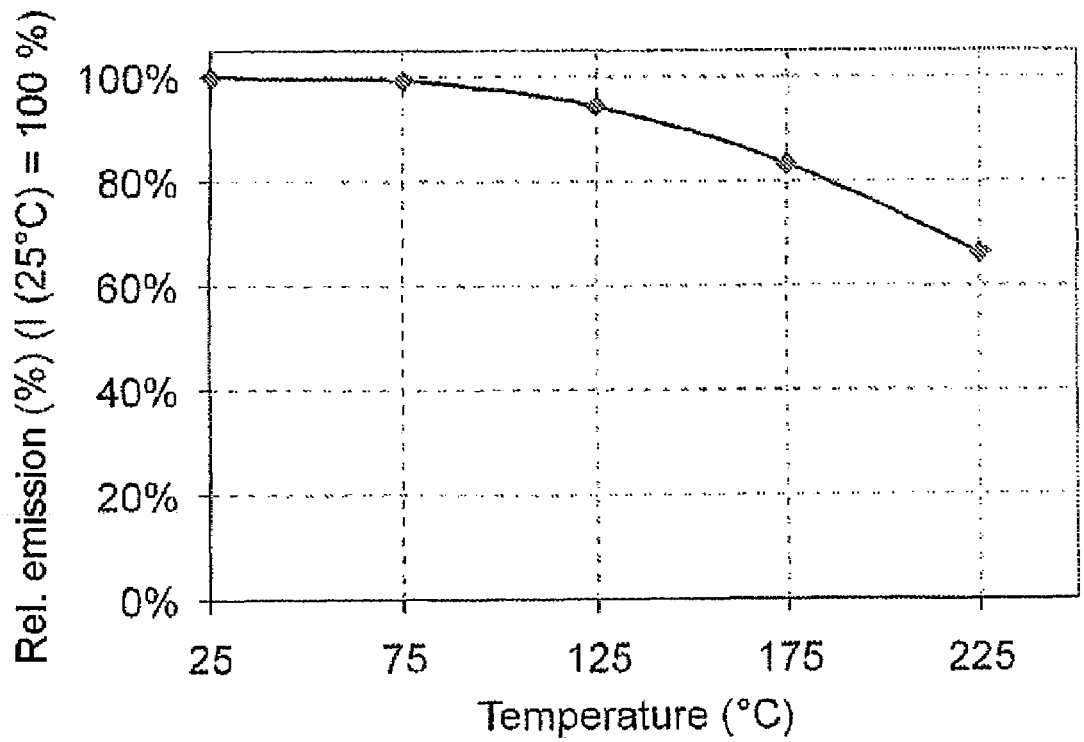
FIG. 8 shows the quenching behavior of the same luminophore as a function of temperature.

FIG. 8 shows the quenching behavior of this specific luminophore as a function of temperature. It is very stable, so that at 175° C. the efficiency is still more than 80% of the efficiency at 25° C. This makes the new luminophore especially attractive for thermally stressful environments, for example in an LED for vehicle headlamps.

Figure 9:
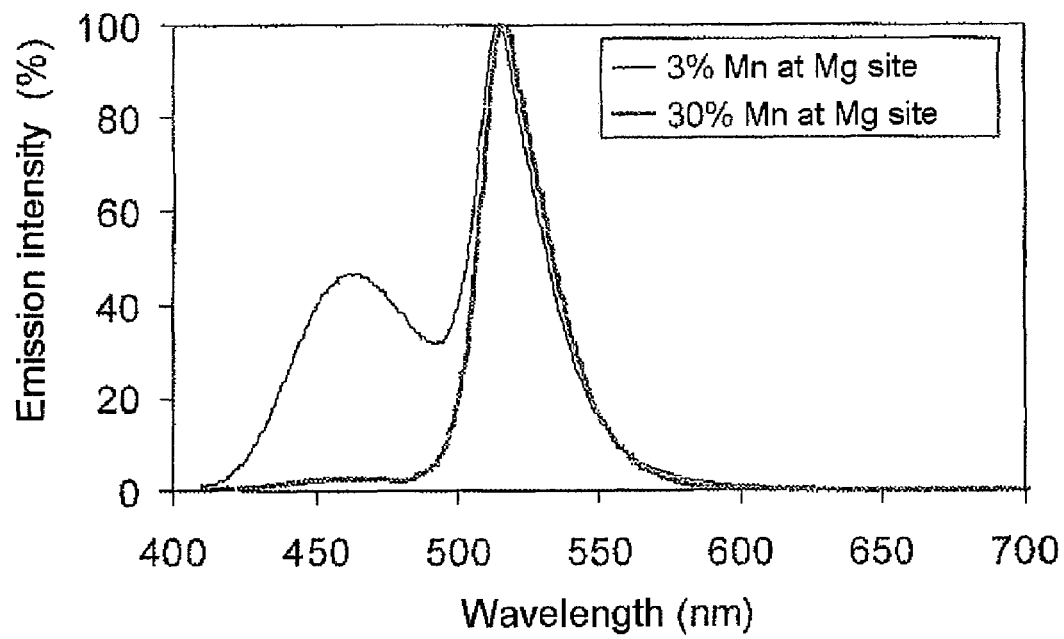
FIG. 9 shows the emission behavior of a modified BAM luminophore with the incorporation of Mn.

FIG. 9 shows the emission behavior of a luminophore having the stoichiometry $Ba_{0.4}Eu_{0.6}Mg_{1-y}Mn_yAl_{10}O_{17}$. Incorporation of Mn at Mg lattice sites makes it possible to produce a highly efficient narrowband green luminophore, which is suitable for less thermally stressful environments, and ideal for example for LCD backlighting.

Figure 10:
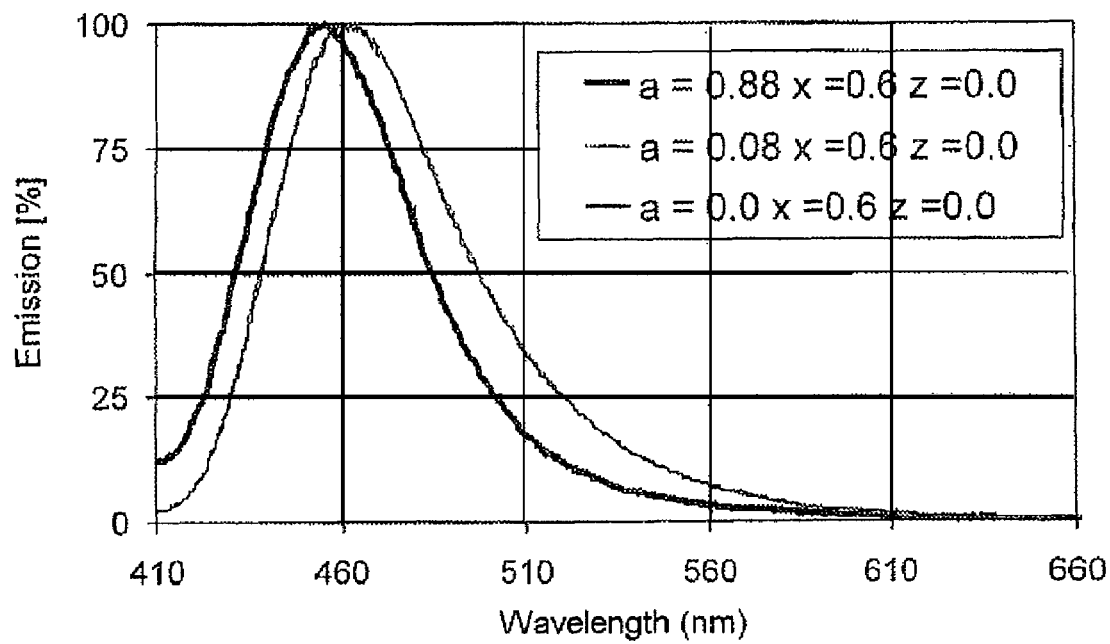
FIG. 10 shows the emission behavior of various luminophores with different stoichiometries.

FIG. 10 shows a comparison of the emission of various mixtures of a low-Ba aluminate phase and of the actual BAM phase. The mixing parameter is a, as described above. With a low aluminate concentration, a=0.08, no significant changes are observed compared with the pure BAM phase, i.e. a=0. The two curves are almost superimposed. With a high aluminate concentration a, a very short-wavelength shift of the emission is obtained. In the exemplary embodiment shown, a=0.88. The Eu concentration x, to be understood as a proportion relative to the metal $M=(Ba_{1-x}, Eu_x)$, is in each case 60%. No Mn is used as a codopant (z=0). This mixing effect can be used for optimal adjustment of the emission wavelength, or its peak, in an LED.

Figure 11:
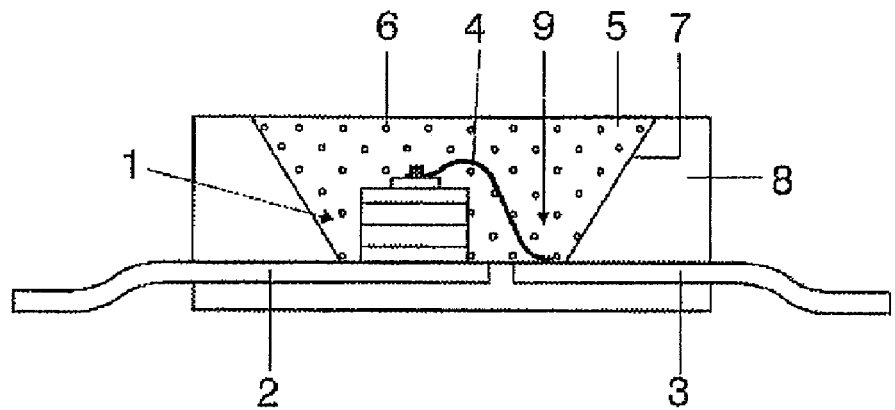
FIG. 11 shows the basic structure of a light source for blue light.

FIG. 11 shows the basic structure of a conversion LED, also referred to as a LUCOLED, having the luminophore according to the invention. The structure of a light source for blue-green light is shown explicitly in FIG. 11. The light source is a semiconductor component having a chip 1 of the InGaN type with a peak emission wavelength in the UV range, for example 405 nm, which is embedded in an opaque base package 8 in the region of an opening 9. The chip 1 is connected to a first terminal 3 via a bonding wire 4, and directly to a second electrical terminal 2. A thin layer 50 of the novel BAM is applied directly on the chip. Electrophoresis is preferably used for this, in order to achieve the optimal small layer thickness of between 5 and 30 μm. Other techniques, as described in the prior art, may also be envisaged for this. What is important is that the proportion of other substances, for example binders, is as low as possible.

The opening 9 is filled with a potting compound 5, which contains as its main constituents a silicone resin (80 to 90 wt. %) and other luminophore pigments 6 (typically less than 20 wt. %). These are a yellow emitting luminophore, such as in particular YAG:Ce. The opening has a wall 7, which acts as a reflector for the primary and secondary radiation from the chip and the pigments 6, respectively. The primary radiation of the UV LED is fully converted into blue radiation by the luminophore. The thinly applied blue emitting luminophore used is the BAM:Eu (60%) described above.

Similarly, a light source for white light can also be produced with such a luminophore, for example by using three luminophores which are excited to emit red, green and blue by the UV radiation source. The green luminophore is for example a Ba-sion, the red one is for example $Ca_5Al_4Si_8N_{18}$:Eu or a nitridosilicate $(Ca, Sr)_2Si_5N_8$:Eu, and the blue one, which is applied directly onto the chip, is an aluminate luminophore such as BAM:Eu with x=0.4.

Figure 12:
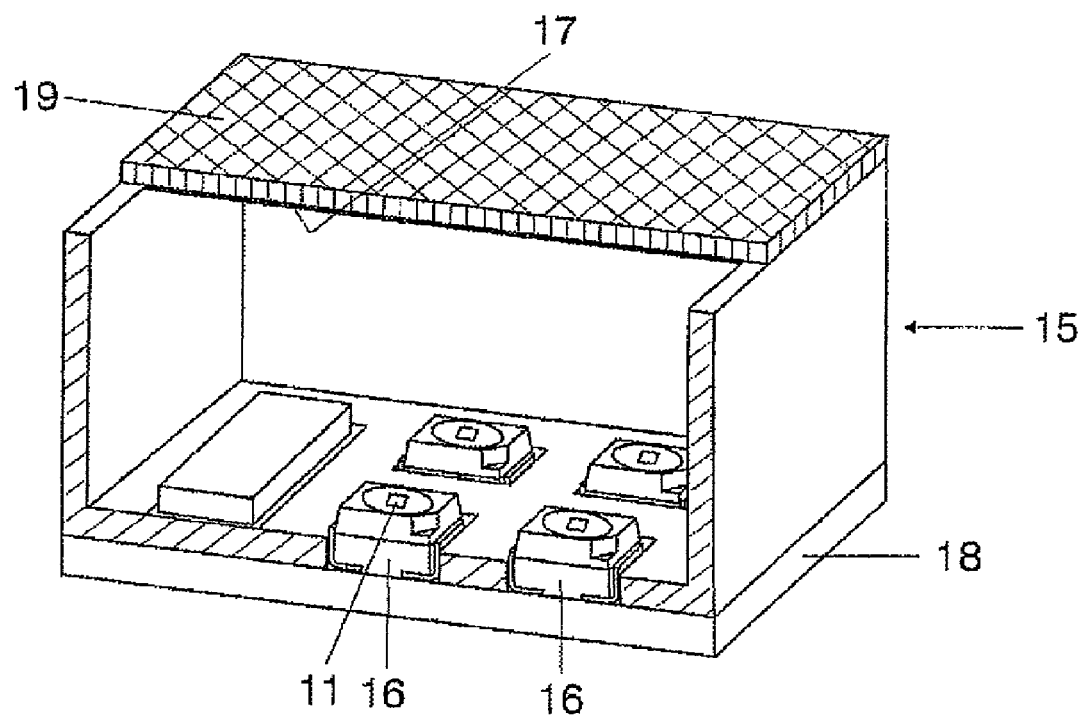
FIG. 12 shows the basic structure of a light source for white light.

The structure of another light source for white light is shown explicitly in FIG. 12. The light source is a semiconductor component 16 of the LED type having a UV emitting chip 11 of the InGaN type with a peak emission wavelength of 380 nm. A thin 20 μm thick layer of a BAM containing a high proportion of europium, in particular BAM:Eu (60%), is applied (not shown) on the chip 11. The semiconductor component 16 has an opaque base package 18 with a side wall 15 and a window 19. The conversion LED 16 is the light source for further luminophores, which are applied on the window 19 in a layer 14. The further luminophore, which partially converts the radiation of the chip 13, is a yellow luminophore such as for example YAG:Ce, which partially converts the primary radiation of the chip 13 and transforms it into yellow radiation with peak emission at 560 nm.

In another exemplary embodiment, a UV LED (about 380 nm) is used as the primary light source for a white RGB luminescence conversion LED, in which case problems of ageing and degradation of the package and resin or further luminophores do not occur because the highly stable BAM luminophore is applied directly on the surface of the chip. It is therefore no longer necessary to comply with otherwise conventional measures, such as careful selection of the package material, addition of UV-resistant resin components. The great advantages of this solution are furthermore the low viewing angle dependency of the emission color and the high color stability.

A conversion LED, in particular based on InGaN, or a lighting module, in particular based on an LED, is preferably suitable as a light source for a lighting system.

The key point of the present invention is that the UV LED chip is coated with a highly compact layer of strongly UV-absorbing luminophore which is available for the first time with the BAM:Eu according to the invention. The layer is preferably selected to be smaller than 30 μm, and at least thick enough for it to absorb essentially all the UV radiation of the chip, so that there is no longer a risk of damage to the package and resin etc. The volume fraction of the luminophore in the compact layer is selected as at least 50%, preferably at least 70%. In particular, an electrophoretically deposited layer is suitable for this. This highly compact layer therefore only contains material which has little susceptibility to aging. The aging of the BAM luminophore, or BAL luminophore, is negligible in this context. The layer is thus substantially aging-resistant.

Conventional coating methods, for example screen printing, are no longer feasible with such high volume fractions of the luminophore. The high viscosity of a luminophore paste with such a high solids content, due to the luminophore, prevents conventional processing. Premature ageing of the potting compound or the package material is avoided by this arrangement. The full luminous power is achieved over the lifetime.

Figure 13:
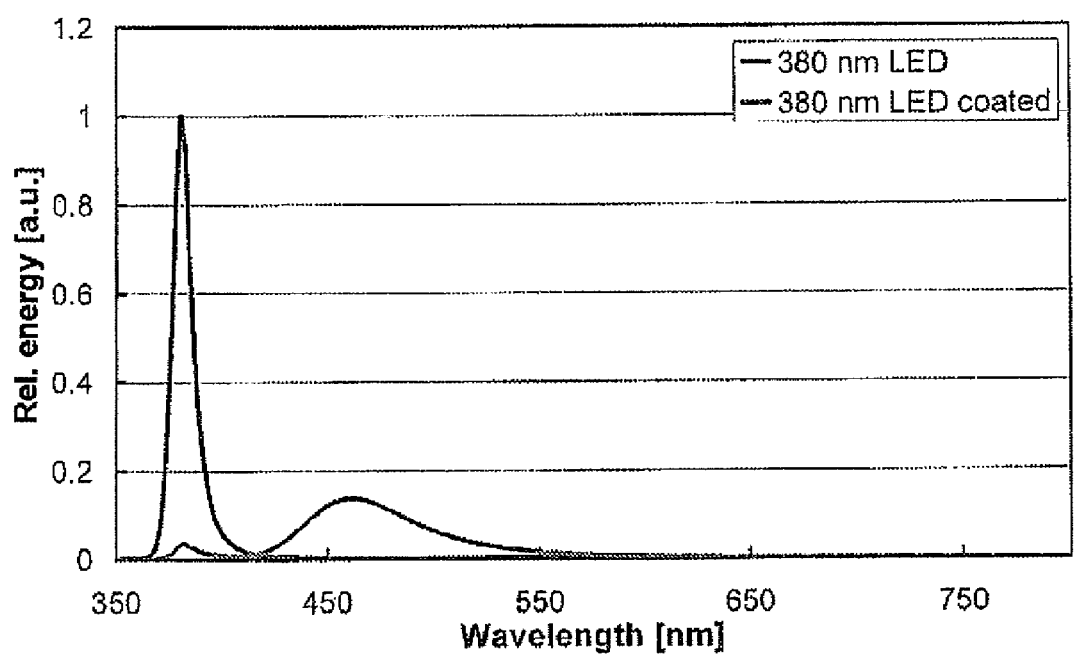
FIG. 13 shows a comparison of the emission spectra of two LEDs.

Full-conversion LEDs generally require very high luminophore concentrations, which entail significant light losses. These losses can now be reduced for the first time by strongly absorbing and therefore low-scattering luminophores. Only the novel BAM:Eu luminophore, owing to its drastically increased near-UV absorption, above all in the range from 360 to 400 nm, due to the high content of Eu activator, in conjunction with blue emission, makes it possible to construct a full-conversion LED for lighting purposes. The great advantage resides in the high efficiency of the conversion as well as the protection of the package from harmful UV radiation. Owing to the low proportion of potting compound in the converting luminophore layer and the low UV intensity outside the converting layer, the overall LED is much less susceptible to UV-induced material ageing. Specifically, FIG. 13 represents a 380 nm LED (primary emission peak) (relative energy, spectrally plotted) which is coated with the luminophore BAM:Eu (60%) according to the invention; the layer thickness is 10 μm. The two emission spectra of an uncoated, clearly encapsulated LED (1) and a coated, clearly encapsulated LED (2) are represented in FIG. 13. Numerically, the energy conversion efficiency adds up to 100% for the uncoated LED (by definition) in comparison with 78% for the coated version.

The LED produced in this way may be regarded as a conventional blue LED with significantly improved properties. The emission has a strong blue-green component, which is almost entirely absent in a conventional LED. In particular, the color rendering of the novel LED benefits from this. Besides pure conversion into blue, all other conversion LEDs may of course also be produced as explained above, in particular white LEDs based on such a novel blue LED. One possibility is coating with YAG:Ce or with YAGaG:Ce. These luminophores have a pronounced absorption gap at around 395 nm (for YAG:Ce) and 380 nm (for YAGaG:Ce). Similar considerations apply for other known garnet luminophores which are doped with Ce. It therefore becomes possible to apply a yellow garnet layer to the BAM:Eu layer according to the invention on the LED, which reflects the remaining transmitted UV radiation back into the BAM:Eu layer. This BAM:Eu or alternatively BAL:Eu layer can therefore be thinner. This luminophore is thus given an additional opportunity to absorb UV radiation. Other luminophores for producing yellow or red light can often be pumped directly with UV radiation, and here too the BAM:Eu layer can be thinner without thereby stressing the package. Mixtures of BAM:Eu with other luminophores are likewise possible. In this case, it is necessary to ensure that the layer still has the necessary compactness.

A particularly valuable property of the novel luminophore is its wide FWHM, which is now about 55 to 65 nm. When using a blue LED (InGaN), this FWHM is typically only 10 to 20 nm, which makes the color rendering of a white LED based thereon much worse than when a white LED is based on the novel blue LED with direct conversion of the UV primary emission by the BAM:Eu layer. Added to this, the current-carrying capacity and thermal stability as well as the wavelength shift with the novel LED are considerably better than in the case of directly emitting blue LEDs.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A conversion LED, comprising:
a primary light source which emits in the short-wave radiation range below 420 nm,
and a luminophore placed in front of it consisting of the BAM system as a host lattice for at least partial conversion of the light source's radiation into longer-wave radiation,
wherein the BAM luminophore is applied as a thin layer having a thickness of at most 50 μm directly on the surface of the light source, the BAM luminophore having the general stoichiometry $(M_{1-r}Mg_r)O*k(Al2O3)$, where r=0.4 to 0.6 and M=$EA_eEu_{1-e}$, with EA=Ba, Sr, Ca, and e=0.52 to 0.8, and k=1.5 to 4.5.

2. The conversion LED as claimed in claim 1, wherein the BAM luminophore has the stoichiometry $M_xEU_{1-x}Mg_{1+d}Al_{10+2f}O_{17+d+3f}$, with
$0.2 \leq x \leq 0.48$;
$0 \leq d \leq 0.1$;
$-0.1 \leq f \leq 1.0$.

3. The conversion LED as claimed in claim 2, wherein $0.35 \leq x \leq 0.45$.

4. The conversion LED as claimed in claim 1, wherein the stoichiometry is $Ba_xEu_{1-x}MgAl_{10}O_{17}$, and $0.35 \leq x \leq 0.45$.

5. The conversion LED as claimed in claim 1, wherein the stoichiometry is $Ba_xEu_{1-x}MgAl_{10}O_{17}$, where x lies in the range x=0.35 to 0.48 and z=0.65 to 0.995.

6. The conversion LED as claimed in claim 1, wherein the stoichiometry is $Ba_xEu_{1-x}Mg_{1+d}Al_{10+2f}O_{17+d+3f}$, where:
$0.2 \leq x \leq 0.48$;
$0 \leq d \leq 0.1$;
$-0.1 \leq f \leq 1.0$.

7. The conversion LED as claimed in claim 6, wherein $0.35 \leq x \leq 0.45$.

8. The conversion LED as claimed in claim 1, for the conversion of primary radiation, the peak wavelength of the primary radiation lying in the range of from 300 to 420 nm.

9. The conversion LED as claimed in claim 8,
wherein the peak wavelength of the primary radiation lies in the range of from 340 to 410 nm.

10. The conversion LED as claimed in claim 1,
wherein the luminophore has the following stoichiometry:
$\{(1-a)*(0.82[Ba_xEu_{1-x}O]*6[Al2O3])\}*a(Ba_xEu_{1-x}MgAl_{10}O_{17})$, where a is in principle given by $0 \leq a \leq 1$, and the value of x lies at from at least 0.52 up to 0.8.

11. The conversion LED as claimed in claim 10,
wherein a at least 0.2, and the value of x lies in the range from x=0.55 to 0.65.

12. The conversion LED as claimed in claim 11,
wherein a is at least 0.8.

13. The conversion LED as claimed claim 1,
wherein Mn is used for codoping.

14. The conversion LED as claimed in claim 1,
wherein e=0.55 to 0.65.

15. A lighting system, comprising:
a conversion LED, comprising:
 a primary light source which emits in the short-wave radiation range below 420 nm,
 and a luminophore placed in front of it consisting of the BAM system as a host lattice for at least partial conversion of the light source's radiation into longer-wave radiation,
 wherein the BAM luminophore is applied as a thin layer having a thickness of at most 50 μm directly on the surface of the light source, the BAM luminophore having the general stoichiometry $(M_{1-r}Mg_r)O*k(Al2O3)$, where r=0.4 to 0.6 and $M=EA_eEu_{1-e}$, with EA=Ba, Sr, Ca, and e=0.52 to 0.8, and k=1.5 to 4.5;
 wherein the light source emits primary radiation with a peak wavelength in the range of from 300 to 420 nm, and
 wherein a luminophore used for the conversion is an aluminate of the BAM host lattice type, which is doped with Eu and optionally also with Mn, the aluminate having the stoichiometry:
$M_xEu_{1-x}Mg_{1-y+d}Mn_yAl_{10+2f}O_{17+d+3f}$ where
$0.2 \leq x \leq 0.48$;
$0 \leq y \leq 0.3$;
$0 \leq d \leq 0.1$;
$-0.1 \leq f \leq 1.0$.

16. The lighting system as claimed in claim 15, wherein the light source is an LED.

17. The lighting system as claimed in claim 16,
wherein the light source is an LED based on InGaN.

18. The lighting system as claimed in claim 15, wherein the light source is a lighting module having an LED.

19. The lighting system as claimed in claim 18,
wherein the light source is a lighting module having an LED based on InGaN.

20. The lighting system as claimed in claim 15,
wherein $0.35 \leq x \leq 0.45$; and
wherein $0 \leq y \leq 0.2$.

* * * * *